US011387284B2

(12) United States Patent
Jiao et al.

(10) Patent No.: US 11,387,284 B2
(45) Date of Patent: Jul. 12, 2022

(54) OLED DISPLAY SUBSTRATE HAVING A QUANTUM DOT COLOR FILM LAYER, MANUFACTURING METHOD OF THE SAME, AND DISPLAY APPARATUS

(71) Applicant: BOE TECHNOLOGY GROUP CO., LTD., Beijing (CN)

(72) Inventors: Zhiqiang Jiao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 24 days.

(21) Appl. No.: 16/639,025

(22) PCT Filed: Aug. 8, 2019

(86) PCT No.: PCT/CN2019/099788
§ 371 (c)(1),
(2) Date: Feb. 13, 2020

(87) PCT Pub. No.: WO2020/030042
PCT Pub. Date: Feb. 13, 2020

(65) Prior Publication Data
US 2020/0273916 A1    Aug. 27, 2020

(30) Foreign Application Priority Data
Aug. 10, 2018   (CN) .......................... 201810908575.1

(51) Int. Cl.
*H01L 27/32* (2006.01)
*H01L 51/50* (2006.01)
(Continued)

(52) U.S. Cl.
CPC ........ *H01L 27/322* (2013.01); *H01L 51/5253* (2013.01); *H01L 51/5278* (2013.01);
(Continued)

(58) Field of Classification Search
CPC .............. H01L 27/322; H01L 27/3211; H01L 51/5253; H01L 51/5276; H01L 51/502;
(Continued)

(56) References Cited

U.S. PATENT DOCUMENTS 7,030,554 B2 *   4/2006   Liao ..................... H01L 27/3211
                                                            313/504
7,142,179 B2 *  11/2006   Miller .................. G09G 3/3233
                                                            345/76
(Continued)

FOREIGN PATENT DOCUMENTS

CN        104112766 A      10/2014
CN        104536198 A       4/2015
(Continued)

OTHER PUBLICATIONS

Office Action of CN Application No. 201810908575.1 and English translation, dated Sep. 9, 2019, 22 pages.
(Continued)

*Primary Examiner* — Ida M Soward
(74) *Attorney, Agent, or Firm* — Muncy, Geissler, Olds & Lowe, P.C.

(57) ABSTRACT

A method of monitoring the closed system includes performing a page capturing on a web page of the closed system, searching from a captured page, according to configuration information of data to be monitored of the closed system, a text content corresponding to the data to be monitored, and converting the text content corresponding to the data to be monitored into monitored data which a system monitoring platform is capable of recognizing, and storing the monitored data.

16 Claims, 4 Drawing Sheets

(51) Int. Cl.
  *H01L 33/06*   (2010.01)
  *H01L 33/04*   (2010.01)
  *H01L 51/52*   (2006.01)
  *H01L 51/56*   (2006.01)
  *G02F 1/1335*  (2006.01)
  *H01L 33/44*   (2010.01)
  *H01L 27/146*  (2006.01)

(52) U.S. Cl.
  CPC ........ *H01L 51/56* (2013.01); *G02F 1/133528* (2013.01); *H01L 27/14678* (2013.01); *H01L 27/323* (2013.01); *H01L 27/3211* (2013.01); *H01L 33/04* (2013.01); *H01L 33/06* (2013.01); *H01L 33/44* (2013.01); *H01L 51/502* (2013.01); *H01L 51/5056* (2013.01); *H01L 51/5072* (2013.01); *H01L 51/5092* (2013.01); *H01L 51/5234* (2013.01); *H01L 51/5293* (2013.01); *H01L 2251/5338* (2013.01)

(58) Field of Classification Search
  CPC ............. H01L 51/5056; H01L 51/5072; H01L 51/5092; H01L 51/5234; H01L 33/04; H01L 33/06
  See application file for complete search history.

(56) References Cited

U.S. PATENT DOCUMENTS

| | | | | |
|---|---|---|---|---|
| 7,279,716 B2* | 10/2007 | Chen | ........ | H01L 33/08 257/79 |
| 2005/0134174 A1* | 6/2005 | Shiratori | ............ | H01L 27/3209 313/506 |
| 2008/0297036 A1* | 12/2008 | Noh | .................... | H01L 51/5278 313/504 |
| 2009/0261354 A1* | 10/2009 | Ha | ..................... | H01L 51/5076 257/E33.044 |
| 2014/0204128 A1* | 7/2014 | Jiang | .................... | G09G 3/3406 349/61 |
| 2016/0027848 A1 | 1/2016 | Liu et al. | | |
| 2016/0079316 A1* | 3/2016 | Zhou | ................... | H01L 51/5056 257/13 |
| 2016/0190515 A1* | 6/2016 | Huang | .................... | G02B 5/201 257/13 |
| 2016/0370655 A1 | 12/2016 | Nagayama et al. | | |
| 2017/0194387 A1 | 7/2017 | Oh et al. | | |
| 2018/0019371 A1* | 1/2018 | Steckel | ................. | H01L 33/502 |
| 2018/0033994 A1* | 2/2018 | Jang | .................... | H01L 51/5024 |
| 2018/0182990 A1* | 6/2018 | Youn | ................... | H01L 51/5044 |
| 2018/0190921 A1 | 7/2018 | Liao | | |
| 2018/0202616 A1 | 7/2018 | Yoon et al. | | |
| 2018/0269260 A1* | 9/2018 | Ghosh | ................. | H01L 27/3211 |
| 2019/0006631 A1* | 1/2019 | Kim | ................... | H01L 51/5044 |
| 2019/0039349 A1* | 2/2019 | Shoda | ....................... | B32B 9/00 |
| 2019/0064603 A1* | 2/2019 | Lee | ....................... | G02B 6/0091 |
| 2019/0148648 A1* | 5/2019 | Lee | .................... | H01L 51/0072 257/40 |
| 2019/0187338 A1* | 6/2019 | Ichiba | ....................... | G02B 1/11 |
| 2020/0035761 A1* | 1/2020 | Hack | ................... | H01L 51/5265 |
| 2020/0174299 A1* | 6/2020 | Nakanishi | ......... | G02F 1/133528 |
| 2020/0243331 A1* | 7/2020 | Wildeson | ............. | H01L 21/02271 |
| 2020/0251040 A1* | 8/2020 | Lee | ....................... | H01L 27/322 |
| 2021/0104697 A1* | 4/2021 | Ohsawa | ............... | H01L 51/5044 |

FOREIGN PATENT DOCUMENTS

| | | |
|---|---|---|
| CN | 105156931 A | 12/2015 |
| CN | 106094339 A | 11/2016 |
| CN | 106531775 A | 3/2017 |
| CN | 106935714 A | 7/2017 |
| CN | 108333826 A | 7/2018 |
| CN | 108333833 A | 7/2018 |
| CN | 109065740 A | 12/2018 |
| WO | WO-2006009612 A1 | 1/2006 |

OTHER PUBLICATIONS

International Search Report of PCT/CN2019/099788 and English translation, dated Oct. 30, 2019, 14 pages.

* cited by examiner

OLED DISPLAY SUBSTRATE HAVING A QUANTUM DOT COLOR FILM LAYER, MANUFACTURING METHOD OF THE SAME, AND DISPLAY APPARATUS

CROSS-REFERENCE TO RELATED APPLICATIONS

This application is a U.S. national phase application of a PCT Application No. PCT/CN2019/099788 filed on Aug. 8, 2019, which claims priority to a Chinese Patent Application No. 201810908575.1, filed in China on Aug. 10, 2018, the disclosure of which are incorporated herein by reference in its entirety.

TECHNICAL FIELD

The present disclosure relates to the field of display technology, and in particular, relates to an OLED display substrate, a method of manufacturing the OLED display substrate, and a display apparatus.

BACKGROUND

An Organic Light-emitting Display (OLED) apparatus has many advantageous features such as self-emission, a low driving voltage, a high light-emitting efficiency, a short response time, a high definition and a high contrast, a near-180° viewing angle, a wide operational temperature range, flexible display, large-area full-color display and so on, and is regarded by the industry as the most promising display apparatus.

SUMMARY

The present disclosure provides an OLED display substrate, a manufacturing method of the OLED display substrate, and a display apparatus.

In a first aspect, the present disclosure provides an organic light-emitting diode (OLED) display substrate. The OLED display substrate includes a first blue OLED light-emitting layer covering an entirety of an active area of the OLED display substrate; one or more additional blue OLED light-emitting layers arranged in a stacking manner with the first blue OLED light-emitting layer; and a quantum-dot color film layer on a light-exiting side of the first blue OLED light-emitting layer and the one or more additional blue OLED light-emitting layers, wherein, a wavelength of blue light emitted by at least one blue OLED light-emitting layer among the one or more additional blue light OLED light-emitting layers is different from a wavelength of blue light emitted by the first blue OLED light-emitting layer.

Optionally, the wavelength of the blue light emitted by the first blue OLED light-emitting layer is in a range of 400-440 nm, the one or more additional blue OLED light-emitting layers include a second blue OLED light-emitting layer, and a wavelength of blue light emitted by the second blue OLED light-emitting layer is in a range of 440-490 nm.

Optionally, the OLED display substrate further includes an anode, a charge generation layer, a first hole injection layer, and a cathode, wherein the anode, the second blue OLED light-emitting layer, the charge generation layer, the first hole injection layer, the first blue OLED light-emitting layer and the cathode are sequentially arranged in a stacking manner.

Optionally, the OLED display substrate further includes a second hole injection layer and a second hole transport layer between the anode and the second blue OLED light-emitting layer, wherein the second hole injection layer is between the anode and the second hole transport layer; a first electron injection layer between the second blue OLED light-emitting layer and the charge generation layer; a first electron transport layer and a second electron injection layer between the first blue OLED light-emitting layer and the cathode, wherein the second electron injection layer is between the first electron transport layer and the cathode.

Optionally, the OLED display substrate further includes a second hole injection layer and a second hole transport layer between the anode and the second blue OLED light-emitting layer, wherein the second hole injection layer is between the anode and the second hole transport layer; a first electron injection layer and a second electron transport layer between the second blue OLED light-emitting layer and the charge generation layer; wherein the first electron injection layer is between the second electron transport layer and the charge generation layer; a first hole injection layer and a first hole transport layer between the first blue OLED light-emitting layer and the charge generation layer, wherein the first hole injection layer is between the charge generation layer and the first hole transport layer; and a first electron transport layer and a second electron injection layer between the first blue OLED light-emitting layer and the cathode, wherein the second electron injection layer is between the cathode and the first electron transport layer.

Optionally, the quantum-dot color film layer includes a red light quantum-dot layer corresponding to a red sub-pixel area, and a green light quantum-dot layer corresponding to a green sub-pixel area, and a blue sub-pixel area is not provided with the quantum-dot color film layer.

Optionally, the quantum-dot color film layer includes a red light quantum-dot layer corresponding to a red sub-pixel area, a green light quantum-dot layer corresponding to a green sub-pixel area, and a blue light quantum-dot layer corresponding to a blue sub-pixel area.

Optionally, the one or more additional blue OLED light-emitting layers cover the entirety of the active area of the OLED substrate.

Optionally, the first blue OLED light-emitting layer is closer to a light-exiting side of the OLED display substrate than the one or more additional blue OLED light-emitting layers, or the one or more additional blue OLED light-emitting layers are closer to a light-exiting side of the OLED display substrate than the first blue OLED light-emitting layer.

Optionally, the blue OLED light-emitting layer is between a first anode and a first cathode, and the one or more additional blue OLED light-emitting layers are between a second anode and a second cathode.

Optionally, the OLED display substrate further includes a thin film encapsulation layer between the cathode and the quantum-dot color film layer.

In a second aspect, the present disclosure provides a display device. The display device includes the OLED display substrate according to the first aspect.

In a third aspect, the present disclosure provides a method of manufacturing an organic light-emitting diode (OLED) display substrate. The method includes following steps: forming one or more blue OLED light-emitting layers in an active area on a substrate; forming a first blue OLED light-emitting layer covering an entirety of the active area of the OLED substrate on the one or more blue OLED light-emitting layers, wherein a wavelength of blue light emitted by at least one blue OLED light-emitting layer among the one or more blue OLED light-emitting layers is different from a wavelength of blue light emitted by the first blue OLED light-emitting layer; forming a quantum-dot color film layer on a light-exiting side of the first blue OLED light-emitting layer and the one or more blue OLED light-emitting layers.

Optionally, the wavelength of the blue light emitted by the first blue OLED light-emitting layer is in a range of 400-440 nm, forming the one or more blue OLED light-emitting layers in the active area on the substrate includes: forming a second blue OLED light-emitting layer in the active area on the substrate, wherein a wavelength of blue light emitted by the second blue OLED light-emitting layer is in a range of 440-490 nm.

Optionally, prior to forming the second blue OLED light-emitting layer in the active area on the substrate, the method further includes: forming an anode on the substrate. After forming the second blue OLED light-emitting layer in the active area on the substrate, prior to forming the first blue OLED light-emitting layer covering the entirety of the active area of the OLED substrate on the second blue OLED light-emitting layer, the method further includes: sequentially forming a charge generation layer and a first hole injection layer on the second blue OLED light-emitting layer. After forming the first blue OLED light-emitting layer covering the entirety of the active area of the OLED substrate on the second blue OLED light-emitting layer, prior to forming the quantum-dot color film layer on the light-exiting side of the first blue OLED light-emitting layer and the second blue OLED light-emitting layers, the method further includes: forming a cathode on the first blue OLED light-emitting layer.

Optionally, the method of manufacturing the OLED display substrate further includes: forming a second hole injection layer and a second hole transport layer between the anode and the second blue OLED light-emitting layer, wherein the second hole injection layer is between the anode and the second hole transport layer; forming a first electron injection layer between the second blue OLED light-emitting layer and the charge generation layer; forming a first electron transport layer and a second electron injection layer between the first blue OLED light-emitting layer and the cathode, wherein the second electron injection layer is between the first electron transport layer and the cathode.

Optionally, the method of manufacturing the OLED display substrate further includes: forming a second hole injection layer and a second hole transport layer between the anode and the second blue OLED light-emitting layer, wherein the second hole injection layer is between the anode and the second hole transport layer; forming a first electron injection layer and a second electron transport layer between the second blue OLED light-emitting layer and the charge generation layer; wherein the first electron injection layer is between the second electron transport layer and the charge generation layer; forming a first hole transport layer between the first hole injection layer and the first blue OLED light-emitting layer; forming a first electron transport layer and a second electron injection layer between the first blue OLED light-emitting layer and the cathode, wherein the second electron injection layer is between the first electron transport layer and the cathode.

Optionally, forming the quantum-dot color film layer includes: forming a red light quantum-dot layer in a red sub-pixel area, forming a green light quantum-dot layer in a green sub-pixel area, and not forming the quantum-dot color film layer in a blue sub-pixel area.

Optionally, forming the quantum-dot color film layer includes: forming a red light quantum-dot layer in a red sub-pixel area, forming a green light quantum-dot layer in a green sub-pixel area, and forming a blue light quantum-dot layer in a blue sub-pixel area.

Optionally, prior to forming the quantum-dot color film layer on the light-exiting side of the first blue OLED light-emitting layer and the one or more blue OLED light-emitting layers, the method further includes: performing a thin film encapsulation on the first blue OLED light-emitting layer and the one or more blue OLED light-emitting layers.

DETAILED DESCRIPTION

Figure 1:
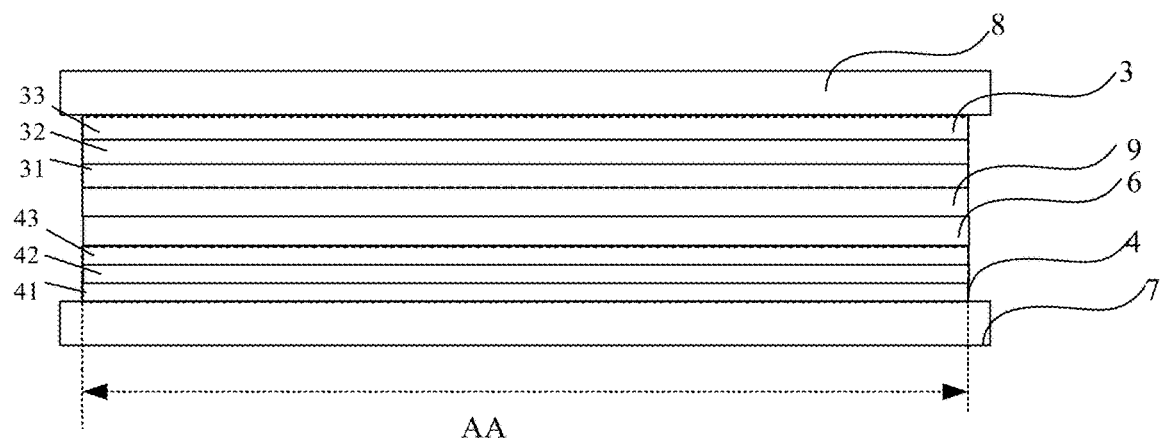
FIG. 1 is a schematic diagram of a first blue OLED light-emitting unit arranged in a stacking manner with a second blue OLED light-emitting unit according to some embodiments of the present disclosure.

In order to make technical problems, technical solutions and advantages of the embodiments of the present disclosure clearer, the present disclosure will be clearly and completely described in detail below with reference to accompanying drawings and specific embodiments.

An OLED device may include: a substrate, an anode on the substrate, a hole injection layer on the anode, a hole transport layer on the hole injection layer, a light-emitting layer on the hole transport layer, an electron transport layer on the light-emitting layer, an electron injection layer on the electron transport layer, and a cathode on the electron injection layer. A light-emitting principle of an OLED device is that a semiconductor material and an organic light-emitting material are driven by an electric field to cause light emission through carrier injection and carrier recombination. Specifically, an indium tin oxide (ITO) pixel electrode and a metal electrode are adopted as the anode and a cathode of the OLED device, respectively. When driven by a certain voltage, electrons and holes are injected from the cathode and the anode into the electron injection layer and the hole injection layer, respectively. The electrons and the holes transfer to the light-emitting layer through the electron transport layer and the hole transport layer, respectively, and meet in the light-emitting layer to form excitons and excite light-emitting molecules which emit visible light through radiative relaxation.

A related process of manufacturing an OLED is relatively complicated, a process accuracy of the process is required to be high, and a production cost of the OLED device is increased. In order to simplify a related process of manufacturing an OLED display device, a blue OLED display device may be used in combination with a color conversion film to achieve full-color display. However, a wavelength of blue light emitted by a related blue OLED display device is about 440-490 nm, which has problems such as a low color conversion efficiency and poor matching between an electroluminescent spectrum of the blue OLED display device and an absorption spectrum of the color conversion film.

The OLED display substrate, the method of manufacturing the OLED display substrate, and the display apparatus provided by the embodiments of the present disclosure may simplify a process of manufacturing a full-color display apparatus, and improve aluminous efficiency and a display quality of the full-color display apparatus.

Some embodiments of the present disclosure provide an OLED display substrate. The OLED display substrate includes: a first blue OLED light-emitting layer covering an entirety of an Active Area (AA) of the OLED display substrate; one or more additional blue OLED light-emitting layers arranged in a stacking manner with the first blue OLED light-emitting layer; and a quantum-dot color film layer on a light-exiting side of the first blue OLED light-emitting layer and the one or more additional blue OLED light-emitting layers. A wavelength of blue light emitted by at least one additional blue OLED light-emitting layer among the one or more additional blue light OLED light-emitting layers is different from a wavelength of blue light emitted by the first blue OLED light-emitting layer. Optionally, the one or more additional blue OLED light-emitting layers cover the entirety of the Active Area of the OLED substrate.

Quantum dots (QDs), also known as nanocrystals, are nanoparticles composed of elements in Group II-VI or elements in Group III-V. Due to a quantum confinement effect on electrons and holes, a continuous band structure becomes a discrete energy level structure with molecular characteristics, and may emit fluorescence after being excited by blue light, and an emission spectrum of the QDs may be controlled by changing a size of the quantum dots, and both fluorescence intensity and stability thereof are very good. Thus, the QD is a very good electroluminescent material. By adjusting the size of the quantum dots in the quantum-dot color film layer, blue light emitted by the first blue OLED light-emitting layer excites the quantum-dot color film layer to emit red light, green light, or emit red light, green light and blue light, thereby realizing a full-color (red, blue, and green) display.

In this embodiment, the first blue OLED light-emitting layer and the one or more additional blue OLED light-emitting layers are formed in the entirety of the Active Area of the OLED display substrate, and the quantum dots are excited by the blue light emitted from the first blue OLED light-emitting layer and the blue light emitted from the one or more additional blue OLED light-emitting layers to emit different colors of light, which avoids manufacturing a plurality of light-emitting layers emitting different colors of light, separately, and simplifies the process of manufacturing a full-color display device. In addition, a wavelength of the blue light emitted by at least one additional blue OLED light-emitting layer among the one or more additional blue OLED light-emitting layers is different from a wavelength of the blue light emitted by the first blue OLED light-emitting layer, such that the first blue OLED light-emitting layer and the at least one additional blue OLED light-emitting layer may emit blue light in a plurality of different wavelength bands, which can improve a matching degree between the electroluminescent spectrum of the OLED light-emitting layer and the absorption spectrum of the quantum-dot color film layer, and improve a color conversion efficiency, a light-emitting efficiency, and a display quality of the full-color display apparatus.

Further, the first blue OLED light-emitting layer is connected to an adjacent blue OLED light-emitting layer in the one or more additional blue OLED light-emitting layers are connected via a charge generation layer.

In this embodiment, the wavelength of the blue light emitted by the first blue OLED light-emitting layer may be 400-440 nm. Because blue light with a shorter wavelength is more harmful to human eyes, a part of the blue light in this band is generally filtered out in order to protect human eyes, which will weaken the blue light emitted by the full-color display apparatus. In order to ensure a light intensity of the blue light emitted by the full-color display apparatus, the display substrate further includes one or more additional blue OLED light-emitting layers arranged in a stacking manner with the first blue OLED light-emitting layer, and a wavelength of blue light emitted by at least one additional blue OLED light-emitting layer among the one or more additional blue OLED light-emitting layers is different from a wavelength of the blue light emitted by the first blue OLED light-emitting layer and will not be filtered out, so the light intensity of the blue light emitted by the full-color display apparatus may be guaranteed.

In order to ensure that the one or more additional blue OLED light-emitting layers may share the anode and the cathode with the first blue OLED light-emitting layer, adjacent blue OLED light-emitting layers are connected via a charge generation layer. The charge generation layer may enable a plurality of blue OLED light-emitting layers to be connected in series. Compared with a single blue OLED light-emitting layer, the plurality of blue OLED light-emitting layers connected in series have a higher luminous efficiency.

In a specific embodiment, the one or more additional blue light OLED light-emitting layers include a second blue light OLED light-emitting layer, and a wavelength of blue light emitted by the second blue OLED light-emitting layer is in a range of 440-490 nm. The wavelength 440-490 nm of the blue light emitted by the second blue OLED light-emitting layer is less harmful to the human eyes and will not be filtered out. The blue light emitted by the second blue OLED light-emitting layer may exit the full-color display apparatus, thereby ensuring the light intensity of the blue light emitted by the full-color display apparatus.

FIG. 1 is a structural schematic diagram of a first blue OLED light-emitting layer arranged in a stacking manner with a second blue OLED light-emitting layer according to some embodiments of the present disclosure. Referring to FIG. 1, the second blue OLED light-emitting layer 42 shares an anode 7 and a cathode 8 with the first blue OLED light-emitting layer 32. The OLED display substrate includes the anode 7, the second blue OLED light-emitting unit 4, a charge generation layer 6, a first hole injection layer 9, the first blue OLED light-emitting unit 3, and a cathode 8, which are sequentially arranged in a stacking manner. The first blue OLED light-emitting unit 3 includes a first hole transport layer 31, a first blue OLED light-emitting layer 32, and a first electron transport layer 33; the second blue OLED light-emitting unit 4 includes a second hole transport layer 41, a second blue OLED light-emitting layer 42, and a second electron transport layer 43. A structure of the OLED display substrate is simplified by sharing the anode and the cathode.

In FIG. 1, the second blue OLED light-emitting unit 4 is shown as being connected to the anode 7 and the first blue OLED light-emitting unit 3 is shown as being connected to the cathode 8. Optionally, however, the first blue OLED light-emitting unit 3 may be connected to the anode 7, the second blue OLED light-emitting unit 4 may be connected to the cathode 8, and the first blue OLED light-emitting unit 3 and the second blue OLED light-emitting unit 4 are connected via the charge generation layer 6. In other words, positions of the first blue OLED light-emitting unit 3 and the second blue OLED light-emitting unit 4 in FIG. 1 may be mutually exchanged. Those skilled in the art may anticipate a structure obtained after the first blue OLED light-emitting unit 3 and the second blue OLED light-emitting unit 4 are mutually exchanged. The structure obtained after the first blue OLED light-emitting unit 3 and the second blue OLED light-emitting unit 4 are mutually exchanged is also within the protection scope of the present disclosure.

Figure 2:
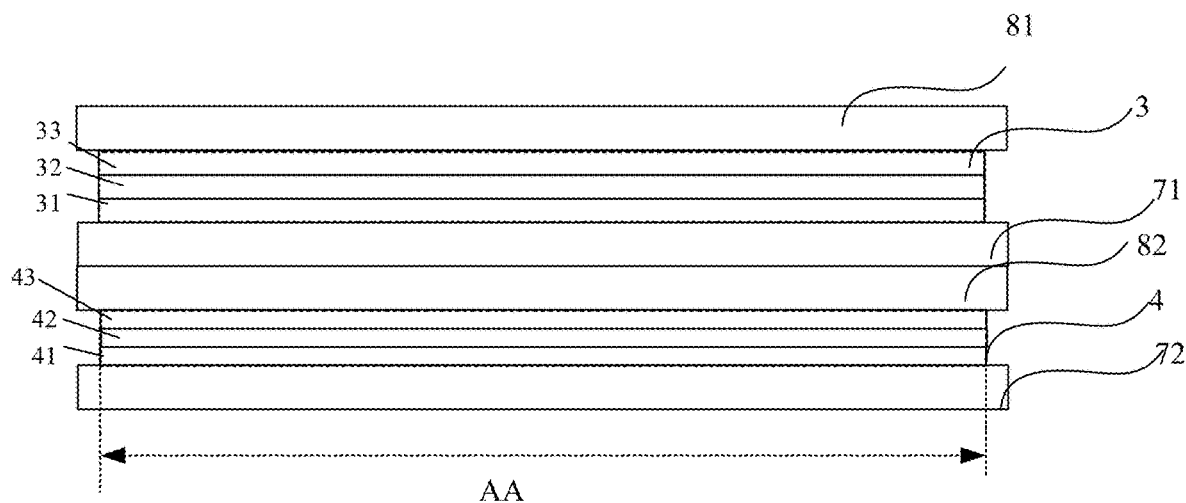
FIG. 2 is a first detailed schematic diagram of a first blue OLED light-emitting layer arranged in a stacking manner with a second blue OLED light-emitting layer according to some embodiments of the present disclosure.

Certainly, it is also possible that the second blue OLED light-emitting unit is independently provided with an anode and a cathode, that is, the second blue OLED light-emitting unit and the first blue OLED light-emitting unit belong to different OLED display devices. FIG. 2 is a detailed schematic diagram of a first blue OLED light-emitting layer arranged in a stacking manner with a second blue OLED light-emitting layer according to some embodiments of the present disclosure. Referring to FIG. 2, the first blue OLED light-emitting unit 3 is connected to a first anode 71 and a first cathode 81; the second blue OLED light-emitting unit 4 is connected to a second anode 72 and a second cathode 82. In the embodiment shown in FIG. 2, since each of the first blue OLED light-emitting unit and the second blue OLED light-emitting unit are independently provided with an anode and a cathode, the first blue OLED light-emitting unit and the second blue OLED light-emitting unit may not be connected via the charge generation layer 6. In this embodiment, the first anode 71, the first cathode 81, the second anode 72, and the second cathode 82 may be made of transparent electrodes.

Similarly, positions of the first blue OLED light-emitting unit 3 and the second blue OLED light-emitting unit 4 in FIG. 2 may be mutually exchanged. Those skilled in the art may anticipate a structure obtained after the first blue OLED light-emitting unit 3 and the second blue OLED light-emitting unit 4 are mutually exchanged. The structure obtained after the first blue OLED light-emitting unit 3 and the second blue OLED light-emitting unit 4 are mutually exchanged is also within the protection scope of the present disclosure.

In addition, the foregoing embodiment is described by using the OLED display substrate including the second blue OLED light-emitting unit and the first blue OLED light-emitting unit. However, the OLED display substrate of the present disclosure is not limited to include the second blue OLED light-emitting unit and the first blue OLED light-emitting unit, and may also include more blue OLED light-emitting units, such as a third blue OLED light-emitting unit. The third blue OLED light-emitting unit is arranged in a stacking manner with the first blue OLED light-emitting unit and the second blue OLED light-emitting unit, and covers the entirety of the Active Area of the OLED display substrate.

Figure 3:
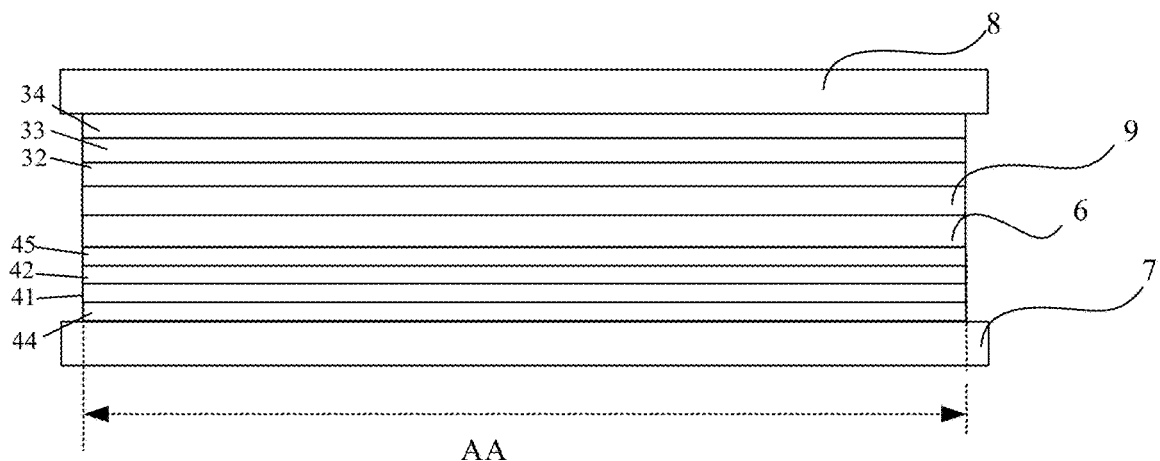
FIG. 3 is a second detailed schematic diagram of a first blue OLED light-emitting layer arranged in a stacking manner with a second blue OLED light-emitting layer according to some embodiments of the present disclosure.

FIG. 3 illustrates another detailed structural diagram of an OLED display substrate according to some embodiments of the present disclosure. Referring to FIG. 3, the OLED display substrate includes: an anode 7, a second blue OLED light-emitting layer 42, a charge generation layer 6, a first hole injection layer 9, a first blue OLED light-emitting layer 32 and a cathode 8 that are sequentially arranged in a stacking manner.

Further, the OLED display substrate further includes: a second hole injection layer 44 and a second hole transport layer 41 between the anode 7 and the second blue OLED light-emitting layer 42, wherein the second hole injection layer 44 is between the anode 7 and the second hole transport layer 41; a first electron injection layer 45 between the second blue OLED light-emitting layer 42 and the charge generation layer 6; a first electron transport layer 33 and a second electron injection layer 34 between the first blue OLED light-emitting layer 32 and the cathode 8, wherein the second electron injection layer 34 is between the cathode 8 and the first blue OLED light-emitting layer 32.

Figure 4:
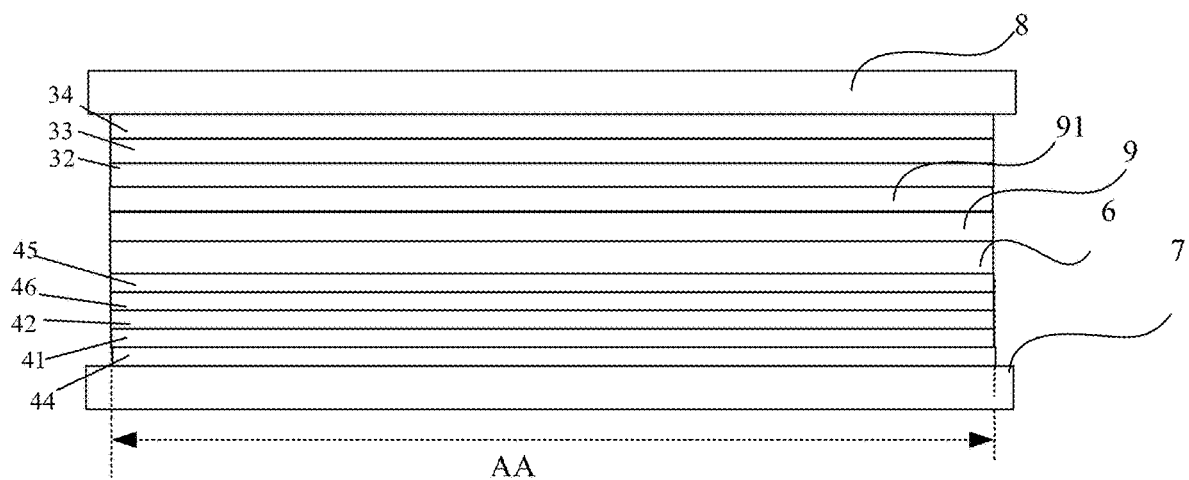
FIG. 4 is a third detailed schematic diagram of a first blue OLED light-emitting layer arranged in a stacking manner with a second blue OLED light-emitting layer according to some embodiments of the present disclosure.

FIG. 4 illustrates yet another detailed structural diagram of an OLED display substrate according to some embodiments of the present disclosure. Referring to FIG. 4, the OLED display substrate includes: an anode 7, a second blue OLED light-emitting layer 42, a charge generation layer 6, a first hole injection layer 9, a first blue OLED light-emitting layer 32 and a cathode 8 that are sequentially arranged in a stacking manner.

Further, the OLED display substrate further includes: a second hole injection layer 44 and a second hole transport layer 41 between the anode 7 and the second blue OLED light-emitting layer 42, wherein the second hole injection layer 44 is between the anode 7 and the second hole transport layer 41; a first electron injection layer 45 and a second electron transport layer 46 between the second blue OLED light-emitting layer 42 and the charge generation layer 6, wherein the second electron transport layer 46 is between the first electron injection layer 45 and the second blue OLED light-emitting layer 42; a first hole transport layer 91 between the first hole injection layer 9 and the first blue OLED light-emitting layer 32; a first electron transport layer 33 and a second electron injection layer 34 between the first blue OLED light-emitting layer 32 and the cathode 8, wherein the second electron injection layer 34 is between the cathode 8 and the first electron transport layer 33.

In a specific embodiment, the quantum-dot color film layer 5 includes a red light quantum-dot layer 51 corresponding to a red sub-pixel area, and a green light quantum-dot layer 52 corresponding to a green sub-pixel area, and the quantum-dot color film layer is not provided in a blue sub-pixel area. In this way, the blue light emitted by the blue sub-pixel is the light directly emitted by the blue OLED light-emitting layer.

Figure 5:
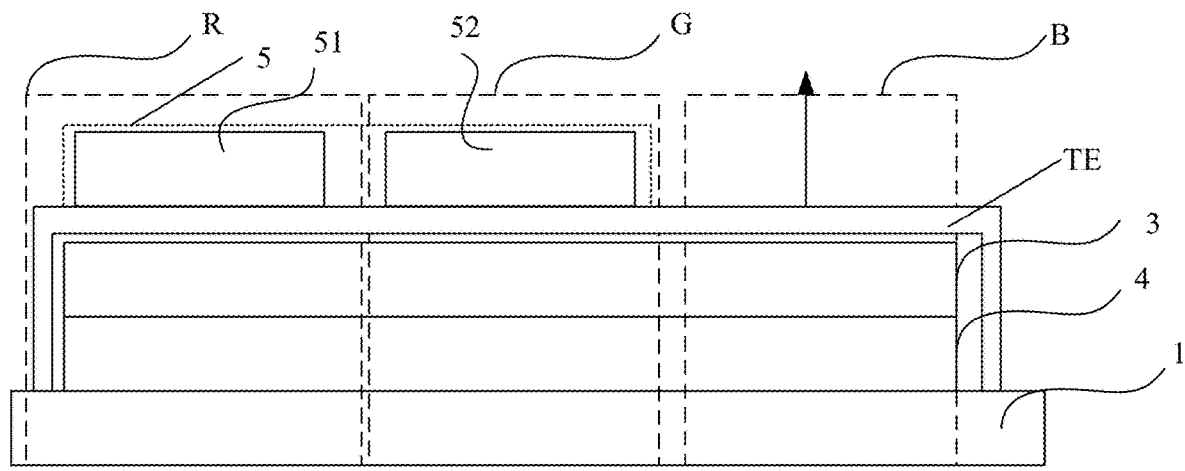
FIG. 5 is a first schematic diagram of an OLED display substrate of the present disclosure.

FIG. 5 is a schematic diagram of an OLED display substrate of the present disclosure. As shown in FIG. 5, the OLED display substrate of the present embodiment includes an array substrate 1 and a first blue OLED light-emitting unit 3 and a second blue OLED light-emitting unit 4 on the array substrate 1, and further includes a quantum-dot color film layer 5 on a light-exiting side of the first blue OLED light-emitting unit 3 and the second blue OLED light-emitting unit 4. The quantum-dot color film layer 5 includes a red light quantum-dot layer 51 located in the red sub-pixel area R, and a green light quantum-dot layer 52 located in the green sub-pixel area G. The quantum-dot color film layer is not provided in the blue sub-pixel area B, and blue light emitted by the first blue OLED light-emitting unit 3 and the second blue OLED light-emitting unit 4 is directly emitted.

In another specific embodiment, the quantum-dot color film layer 5 includes a red light quantum-dot layer R corresponding to a red sub-pixel area, a green light quantum-dot layer G corresponding to a green sub-pixel area, and a blue light quantum-dot layer B corresponding to a blue sub-pixel area. In this way, the blue light emitted by the blue sub-pixel is light emitted by the blue light quantum-dot layer under excitation from blue light directly emitted by the blue OLED light-emitting layer.

Figure 6:
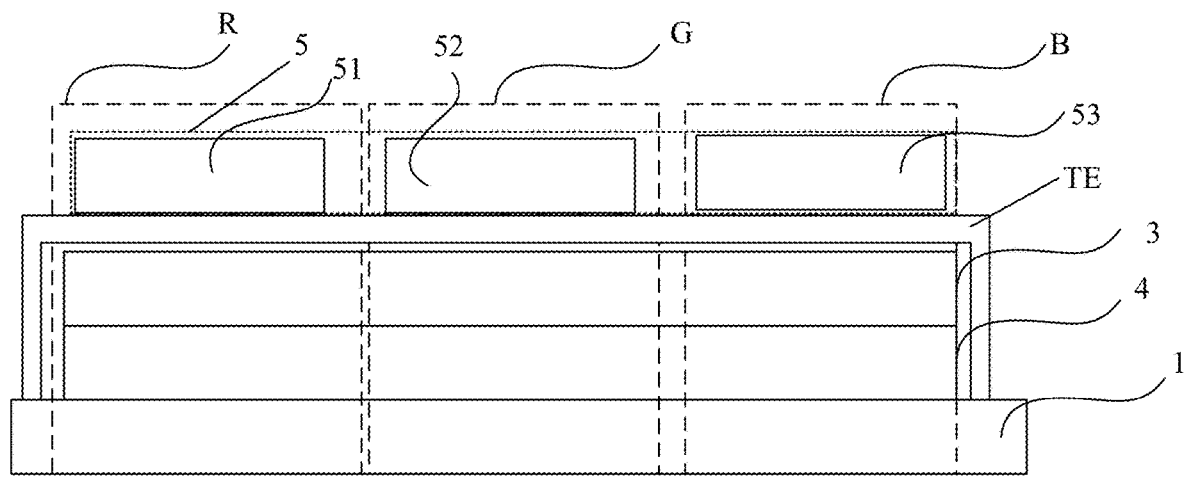
FIG. 6 is a second schematic diagram of an OLED display substrate of the present disclosure.

FIG. 6 is a schematic diagram of an OLED display substrate of the present disclosure. As shown in FIG. 6, the OLED display substrate of the present embodiment includes an array substrate 1 and a first blue OLED light-emitting unit 3 and a second blue OLED light-emitting unit 4 on the array substrate 1, and further includes a quantum-dot color film layer 5 on a light-exiting side of the first blue OLED light-emitting unit 3 and the second blue OLED light-emitting unit 4. The quantum-dot color film layer includes a red light quantum-dot layer 51 located in the red sub-pixel area R, a green light quantum-dot layer 52 located in the green sub-pixel area G, and a blue light quantum-dot layer 53 located in the blue sub-pixel area B.

Optionally, the OLED display substrate further includes a thin film encapsulation layer TE between the cathode 8 and the quantum-dot color film layer 5.

Some embodiments of the present disclosure also provide a display apparatus including the OLED display substrate as described above. The display apparatus may be any product or component having a display function, such as a television, a monitor, a digital photo frame, a mobile phone, and a tablet computer. The display apparatus further includes a flexible circuit board, a printed circuit board, and a back plate.

Figure 7:
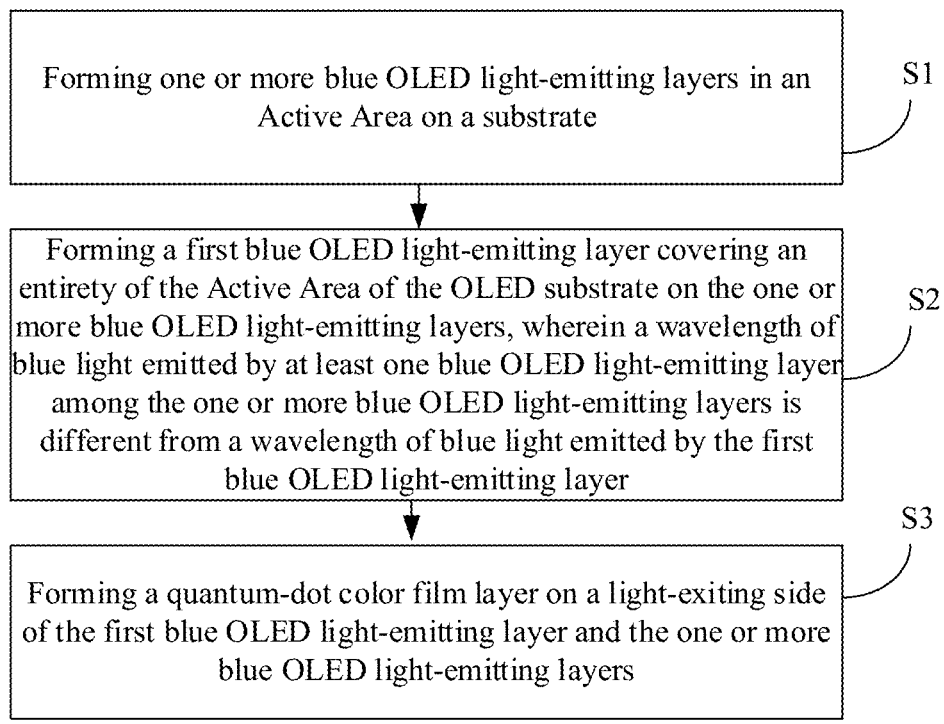
FIG. 7 is a flowchart of a method of manufacturing an OLED display substrate of the present disclosure.

Some embodiments of the present disclosure also provide a method of manufacturing an OLED display substrate, and the manufacturing method may be used for manufacturing the OLED display substrate described above in the present disclosure. FIG. 7 is a flowchart of a method of manufacturing an OLED display substrate provided by some embodiments of the present disclosure. The method of manufacturing the OLED display substrate includes the following steps S1-S3.

S1: forming one or more blue OLED light-emitting layers in an Active Area on a substrate;

S2: forming a first blue OLED light-emitting layer covering an entirety of the Active Area of the OLED substrate on the one or more blue OLED light-emitting layers, wherein a wavelength of blue light emitted by at least one blue OLED light-emitting layer among the one or more blue OLED light-emitting layers is different from a wavelength of blue light emitted by the first blue OLED light-emitting layer;

S3: forming a quantum-dot color film layer on a light-exiting side of the first blue OLED light-emitting layer and the one or more blue OLED light-emitting layers.

Quantum dots (QDs), also known as nanocrystals, are nanoparticles composed of elements in Group II-VI or elements in Group III-V. Due to a quantum confinement effect on electrons and holes, a continuous band structure becomes a discrete energy level structure with molecular characteristics, and may emit fluorescence after being excited by blue light, and an emission spectrum of the QDs may be controlled by changing a size of the quantum dots, and both fluorescence intensity and stability thereof are very good. Thus, the QD is a very good electroluminescent material. By adjusting the size of the quantum dots in the quantum-dot color film layer, blue light emitted by the first blue OLED light-emitting layer excites the quantum-dot color film layer to emit red light, green light, or emit red light, green light and blue light, thereby realizing a full-color (red, blue, and green) display.

In this embodiment, the first blue OLED light-emitting layer and the one or more additional blue OLED light-emitting layers are formed in the entirety of the Active Area of the OLED display substrate, and the quantum dots are excited by the blue light emitted from the first blue OLED light-emitting layer and the blue light emitted from the one or more additional blue OLED light-emitting layers to emit different colors of light, which avoids manufacturing a plurality of light-emitting layers emitting different colors of light, separately, and simplifies the process of manufacturing a full-color display device. In addition, a wavelength of the blue light emitted by at least one additional blue OLED light-emitting layer among the one or more additional blue OLED light-emitting layers is different from a wavelength of the blue light emitted by the first blue OLED light-emitting layer, such that the first blue OLED light-emitting layer and the at least one additional blue OLED light-emitting layer may emit blue light in a plurality of different wavelength bands, which can improve a matching degree between the electroluminescent spectrum of the OLED light-emitting layer and the absorption spectrum of the quantum-dot color film layer, and improve a color conversion efficiency, a light-emitting efficiency, and a display quality of the full-color display apparatus.

Figure 8:
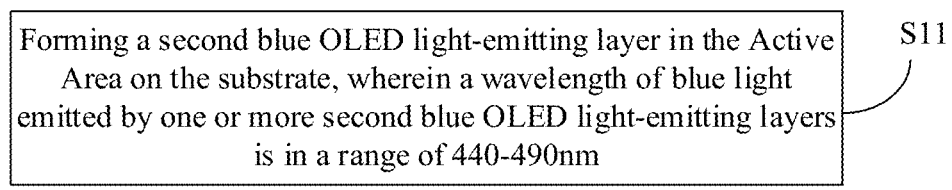
FIG. 8 is a detailed flowchart of a step S1 of the method of manufacturing an OLED display substrate of the present disclosure.

FIG. 8 is a detailed flowchart of the step S1 of the method of manufacturing an OLED display substrate of the present disclosure. Referring to FIG. 8, a wavelength of the blue light emitted by the first blue OLED light-emitting layer is in a range of 400-440 nm, the step S1 of forming the one or more blue OLED light-emitting layers in the Active Area on the substrate includes the following substep S11:

S11: forming a second blue OLED light-emitting layer in the Active Area on the substrate, wherein a wavelength of blue light emitted by one or more second blue OLED light-emitting layers is in a range of 440-490 nm.

The wavelength of the blue light emitted by the first blue OLED light-emitting layer may be 400-440 nm. Because blue light with a shorter wavelength is more harmful to human eyes, a part of the blue light in this band is generally filtered out in order to protect human eyes, which will weaken the blue light emitted by the full-color display apparatus. In order to ensure a light intensity of the blue light emitted by the full-color display apparatus, the display substrate further includes one or more additional blue OLED light-emitting layers arranged in a stacking manner with the first blue OLED light-emitting layer, and a wavelength of blue light emitted by at least one additional blue OLED light-emitting layer among the one or more additional blue OLED light-emitting layers is different from a wavelength of the blue light emitted by the first blue OLED light-emitting layer and will not be filtered out, so the light intensity of the blue light emitted by the full-color display apparatus may be guaranteed. In order to ensure that the one or more additional blue OLED light-emitting layers may share the anode and the cathode with the first blue OLED light-emitting layer, adjacent blue OLED light-emitting layers are connected via a charge generation layer. The charge generation layer may enable a plurality of blue OLED light-emitting layers to be connected in series. Compared with a single blue OLED light-emitting layer, the plurality of blue OLED light-emitting layers connected in series have a higher luminous efficiency. The wavelength 440-490 nm of the blue light emitted by the second blue OLED light-emitting layer is less harmful to the human eyes and will not be filtered out. The blue light emitted by the second blue OLED light-emitting layer may exit the full-color display apparatus, thereby ensuring the light intensity of the blue light emitted by the full-color display apparatus.

In a specific embodiment, prior to forming the second blue OLED light-emitting layer in the Active Area on the substrate, the method further includes: forming an anode on the substrate; after forming the second blue OLED light-emitting layer in the Active Area on the substrate, prior to forming the first blue OLED light-emitting layer covering the entirety of the Active Area of the OLED substrate on the second blue OLED light-emitting layer, the method further includes: sequentially forming a charge generation layer and a first hole injection layer on the second blue OLED light-emitting layer. After forming the first blue OLED light-emitting layer covering the entirety of the Active Area of the OLED substrate on the second blue OLED light-emitting layer, prior to forming the quantum-dot color film layer on the light-exiting side of the first blue OLED light-emitting layer and the second blue OLED light-emitting layer, the method further includes: forming a cathode on the first blue OLED light-emitting layer.

Further, the manufacturing method further includes: forming a second hole injection layer and a second hole transport layer between the anode and the second blue OLED light-emitting layer; forming a first electron injection layer between the second blue OLED light-emitting layer and the charge generation layer; sequentially forming a first electron transport layer and a second electron injection layer between the first blue OLED light-emitting layer and the cathode.

Optionally, in a specific embodiment, prior to forming the second blue OLED light-emitting layer in the Active Area on the substrate, the method further includes: forming an anode on the substrate. After forming the second blue OLED light-emitting layer in the Active Area on the substrate, prior to forming the first blue OLED light-emitting layer covering the entirety of the Active Area of the OLED substrate on the second blue OLED light-emitting layer, the method further includes: sequentially forming a charge generation layer and a first hole injection layer on the second blue OLED light-emitting layer. After forming the first blue OLED light-emitting layer covering the entirety of the Active Area of the OLED substrate on the second blue OLED light-emitting layer, prior to forming the quantum-dot color film layer on the light-exiting side of the first blue OLED light-emitting layer and the second blue OLED light-emitting layers, the method further includes: forming a cathode on the first blue OLED light-emitting layer.

Further, the manufacturing method further includes: forming a second hole injection layer and a second hole transport layer between the anode and the second blue OLED light-emitting layer, wherein the second hole injection layer is between the anode and the second hole transport layer; forming a first electron injection layer and a second electron transport layer between the second blue OLED light-emitting layer and the charge generation layer, wherein the first electron injection layer is between the second electron transport layer and the charge generation layer; forming a first electron transport layer and a second electron injection layer between the first blue OLED light-emitting layer and the cathode, wherein the second electron injection layer is between the cathode and the first electron transport layer.

In a specific embodiment, forming the quantum-dot color film layer includes: forming a red light quantum-dot layer in a red sub-pixel area, forming a green light quantum-dot layer in a green sub-pixel area, and not forming the quantum-dot color film layer in a blue sub-pixel area. In this way, the blue light emitted by the blue sub-pixel is the light directly emitted by the blue OLED light-emitting layer.

Specifically, the method of manufacturing the OLED display substrate includes: manufacturing a blue OLED display device on an entire surface of the array substrate, wherein the blue OLED display device may specifically include an anode, a second hole injection layer, a second hole transport layer, a second blue OLED light-emitting layer, a first electron injection layer, a charge generation layer, a first hole injection layer, a first blue OLED light-emitting layer, a first electron transport layer, a second electron injection layer and a cathode; then performing a thin film encapsulation, manufacturing a quantum-dot color film layer on a light-exiting side of the thin film encapsulation layer, specifically, sequentially forming a red light quantum-dot layer in a red sub-pixel area and a green light quantum-dot layer in a green sub-pixel area. The quantum-dot color film layer may be manufactured by a printing process, and the quantum-dot color film layer may also be manufactured by a patterning process after a coating process.

Optionally, the method of manufacturing the OLED display substrate includes: manufacturing a blue OLED display device on an entire surface of an array substrate, wherein the blue OLED display device may specifically include an anode, a second hole injection layer, a second hole transport layer, a second blue OLED light-emitting layer, a second electron transport layer, a first electron injection layer, a charge generation layer, a first hole injection layer, a first hole transport layer, a first blue OLED light-emitting layer, a first electron transport layer, a second electron injection layer and a cathode; then performing a thin film encapsulation, manufacturing a quantum-dot color film layer on a light-exiting side of the thin film encapsulation layer, specifically, sequentially forming a red light quantum-dot layer in a red sub-pixel area, a green light quantum-dot layer in a green sub-pixel area, and a blue light quantum-dot layer in a blue sub-pixel area. The quantum-dot color film layer may be manufactured by a printing process, and the quantum-dot color film layer may also be manufactured by a patterning process after a coating process.

In another specific embodiment, forming the quantum-dot color film layer includes: forming a red light quantum-dot layer in a red sub-pixel area, forming a green light quantum-dot layer in a green sub-pixel area, and forming a blue light quantum-dot layer in a blue sub-pixel area. In this way, the blue light emitted by the blue sub-pixel is the light emitted by the blue light quantum-dot layer under excitation from the blue light directly emitted by the blue OLED light-emitting layer.

Specifically, the method of manufacturing the OLED display substrate includes: manufacturing a blue OLED display device on an entire surface of an array substrate, wherein the blue OLED display device may specifically include an anode, a second hole injection layer, a second hole transport layer, a second blue OLED light-emitting layer, a first electron injection layer, a charge generation layer, a first hole injection layer, a first blue OLED light-emitting layer, a first electron transport layer, a second electron injection layer and a cathode; then performing a thin film encapsulation, manufacturing a quantum-dot color film layer on a light-exiting side of the thin film encapsulation layer, specifically, sequentially forming a red light quantum-dot layer in a red sub-pixel area, a green light quantum-dot layer in a green sub-pixel area, and a blue light quantum-dot layer in a blue sub-pixel area. The quantum-dot color film layer may be manufactured by a printing process, and the quantum-dot color film layer may also be manufactured by a patterning process after a coating process.

Optionally, the method of manufacturing the OLED display substrate includes: manufacturing a blue OLED display device on an entire surface of an array substrate, wherein the blue OLED display device may specifically include an anode, a second hole injection layer, a second hole transport layer, a second blue OLED light-emitting layer, a second electron transport layer, a first electron injection layer, a charge generation layer, a first hole injection layer, a first hole transport layer, a first blue OLED light-emitting layer, a first electron transport layer, a second electron injection layer and a cathode; then performing a thin film encapsulation, manufacturing a quantum-dot color film layer on a light-exiting side of the thin film encapsulation layer, specifically, sequentially forming a red light quantum-dot layer in a red sub-pixel area, a green light quantum-dot layer in a green sub-pixel area, and a blue light quantum-dot layer in a blue sub-pixel area. The quantum-dot color film layer may be manufactured by a printing process, and the quantum-dot color film layer may also be manufactured by a patterning process after a coating process.

The embodiments of the present disclosure have the following beneficial effects: in the above solution, a first blue OLED light-emitting layer and one or more additional blue OLED light-emitting layers are formed in the entirety of the Active Area of the OLED display substrate, and the quantum dots are excited by the blue light emitted from the first blue OLED light-emitting layer and the one or more additional blue OLED light-emitting layers to emit different colors of light, which avoids manufacturing a plurality of light-emitting layers emitting different colors of light separately, and simplifies the process of manufacturing the full-color display device. In addition, a wavelength of blue light emitted by at least one additional blue OLED light-emitting layer among one or more blue OLED light-emitting layers is different from a wavelength of blue light emitted by the first blue OLED light-emitting layer, such that t the first blue OLED light-emitting layer and the one or more additional blue OLED light-emitting layers may emit blue light in a plurality of different wavelength bands, which can improve the matching degree between the electroluminescent spectrum of the OLED light-emitting layer and the absorption spectrum of the quantum-dot color film layer, and improve the color conversion efficiency, light-emitting efficiency, and display quality of the full-color display apparatus.

Unless defined otherwise, technical and scientific terms used in the present disclosure have common meaning understood by those of ordinary skills in the art to which the present disclosure belong. Such terms as "first", "second", and the like used in the present disclosure do not indicate any order, any quantity, or any importance, but are only used to distinguish different components. Such word as "include" or "comprise" means that elements or items appearing before the word cover elements or items appearing after the word and equivalence thereof without excluding other elements or items. Such word as "connected" or "connecting" are not limited to physical or mechanical connections, but may include electrical connections, whether the connection is a direct connection or an indirect connection. "Up", "down", "left", "right", etc. are only used to indicate a relative position relationship. When an absolute position of the described object changes, the relative position relationship may also change accordingly.

It will be understood that when an element such as a layer, a film, a region, or a substrate is referred to as being located "on" or "under" another element, the element can be "directly" located "on" or "under" the another element, or intervening elements may also be present.

The descriptions above are optional embodiments of the disclosure, it should be noted that various improvements and embellishments may be made within the scope of the present disclosure by one skilled in the art, and such improvement and embellishment shall be within the protection scope of the present disclosure.

What is claimed is:

1. An organic light-emitting diode (OLED) display substrate, comprising:
   a first blue OLED light-emitting layer covering an entirety of an active area of the OLED display substrate;
   one or more additional blue OLED light-emitting layers arranged in a stacking manner with the first blue OLED light-emitting layer; and
   a quantum-dot color film layer on a light-exiting side of the first blue OLED light-emitting layer and the one or more additional blue OLED light-emitting layers,
   wherein, a wavelength of blue light emitted by at least one blue OLED light-emitting layer among the one or more additional blue light OLED light-emitting layers is different from a wavelength of blue light emitted by the first blue OLED light-emitting layer,
   wherein the wavelength of the blue light emitted by the first blue OLED light-emitting layer is in a range of 400-440 nm, the one or more additional blue OLED light-emitting layers comprise a second blue OLED light-emitting layer, and a wavelength of blue light emitted by the second blue OLED light-emitting layer is in a range of 440 nm-490 nm,
   wherein the OLED display substrate further comprises an anode, a charge generation layer, a first hole injection layer, and a cathode, and
   wherein the anode, the second blue OLED light-emitting layer, the charge generation layer, the first hole injection layer, the first blue OLED light-emitting layer and the cathode are sequentially arranged in a stacking manner.

2. The OLED display substrate according to claim 1, further comprising:
   a second hole injection layer and a second hole transport layer between the anode and the second blue OLED light-emitting layer, wherein the second hole injection layer is between the anode and the second hole transport layer;
   a first electron injection layer between the second blue OLED light-emitting layer and the charge generation layer;
   a first electron transport layer and a second electron injection layer between the first blue OLED light-emitting layer and the cathode, wherein the second electron injection layer is between the first electron transport layer and the cathode.

3. The OLED display substrate according to claim 1, further comprising:
   a second hole injection layer and a second hole transport layer between the anode and the second blue OLED light-emitting layer, wherein the second hole injection layer is between the anode and the second hole transport layer;
   a first electron injection layer and a second electron transport layer between the second blue OLED light-emitting layer and the charge generation layer; wherein the first electron injection layer is between the second electron transport layer and the charge generation layer;

the first hole injection layer and a first hole transport layer between the first blue OLED light-emitting layer and the charge generation layer, wherein the first hole injection layer is between the charge generation layer and the first hole transport layer; and a first electron transport layer and a second electron injection layer between the first blue OLED light-emitting layer and the cathode, wherein the second electron injection layer is between the cathode and the first electron transport layer.

4. The OLED display substrate according to claim 1, wherein the quantum-dot color film layer comprises a red light quantum-dot layer corresponding to a red sub-pixel area, and a green light quantum-dot layer corresponding to a green sub-pixel area, and a blue sub-pixel area is not provided with the quantum-dot color film layer.

5. The OLED display substrate according to claim 4, further comprising:

a thin film encapsulation layer between the cathode and the quantum-dot color film layer.

6. The OLED display substrate according to claim 1, wherein the quantum-dot color film layer comprises a red light quantum-dot layer corresponding to a red sub-pixel area, a green light quantum-dot layer corresponding to a green sub-pixel area, and a blue light quantum-dot layer corresponding to a blue sub-pixel area.

7. The OLED display substrate according to claim 1, wherein the one or more additional blue OLED light-emitting layers cover the entirety of the active area of the OLED display substrate.

8. The OLED display substrate according to claim 1, wherein the first blue OLED light-emitting layer is closer to a light-exiting side of the OLED display substrate than the one or more additional blue OLED light-emitting layers, or the one or more additional blue OLED light-emitting layers are closer to a light-exiting side of the OLED display substrate than the first blue OLED light-emitting layer.

9. A display apparatus, comprising:
the OLED display substrate according to claim 1.

10. An organic light-emitting diode (OLED) display substrate, comprising:

a first blue OLED light-emitting layer covering an entirety of an active area of the OLED display substrate;

one or more additional blue OLED light-emitting layers arranged in a stacking manner with the first blue OLED light-emitting layer; and a quantum-dot color film layer on a light-exiting side of the first blue OLED light-emitting layer and the one or more additional blue OLED light-emitting layers, wherein, a wavelength of blue light emitted by at least one blue OLED light-emitting layer among the one or more additional blue light OLED light-emitting layers is different from a wavelength of blue light emitted by the first blue OLED light-emitting layer, and wherein the first blue OLED light-emitting layer is between a first anode and a first cathode, and the one or more additional blue OLED light-emitting layers are between a second anode and a second cathode.

11. A method of manufacturing an organic light-emitting diode (OLED) display substrate, comprising:

forming one or more blue OLED light-emitting layers in an active area on a substrate;

forming a first blue OLED light-emitting layer covering an entirety of the active area of the OLED display substrate on the one or more blue OLED light-emitting layers, wherein a wavelength of blue light emitted by at least one blue OLED light-emitting layer among the one or more blue OLED light-emitting layers is different from a wavelength of blue light emitted by the first blue OLED light-emitting layer;

forming a quantum-dot color film layer on a light-exiting side of the first blue OLED light-emitting layer and the one or more blue OLED light-emitting layers, wherein, the wavelength of the blue light emitted by the first blue OLED light-emitting layer is in a range of 400 nm-440 nm, forming the one or more blue OLED light-emitting layers in the active area on the substrate comprises forming a second blue OLED light-emitting layer in the active area on the substrate, wherein a wavelength of blue light emitted by the second blue OLED light-emitting layer is in a range of 440 nm-490 nm, wherein, prior to forming the second blue OLED light-emitting layer in the active area on the substrate, the method further comprises: forming an anode on the substrate, wherein, after forming the second blue OLED light-emitting layer in the active area on the substrate, prior to forming the first blue OLED light-emitting layer covering the entirety of the active area of the OLED display substrate on the second blue OLED light-emitting layer, the method further comprises sequentially forming a charge generation layer and a first hole injection layer on the second blue OLED light-emitting layer, and wherein, after forming the first blue OLED light-emitting layer covering the entirety of the active area of the OLED display substrate on the second blue OLED light-emitting layer, prior to forming the quantum-dot color film layer on the light-exiting side of the first blue OLED light-emitting layer and the second blue OLED light-emitting layers, the method further comprises forming a cathode on the first blue OLED light-emitting layer.

12. The method of manufacturing the OLED display substrate according to claim 11, further comprising:

forming a second hole injection layer and a second hole transport layer between the anode and the second blue OLED light-emitting layer, wherein the second hole injection layer is between the anode and the second hole transport layer;

forming a first electron injection layer between the second blue OLED light-emitting layer and the charge generation layer;

forming a first electron transport layer and a second electron injection layer between the first blue OLED light-emitting layer and the cathode, wherein the second electron injection layer is between the first electron transport layer and the cathode.

13. The method of manufacturing the OLED display substrate according to claim 11, further comprising:

forming a second hole injection layer and a second hole transport layer between the anode and the second blue OLED light-emitting layer, wherein the second hole injection layer is between the anode and the second hole transport layer;

forming a first electron injection layer and a second electron transport layer between the second blue OLED light-emitting layer and the charge generation layer; wherein the first electron injection layer is between the second electron transport layer and the charge generation layer;

forming a first hole transport layer between the first hole injection layer and the first blue OLED light-emitting layer;

forming a first electron transport layer and a second electron injection layer between the first blue OLED light-emitting layer and the cathode, wherein the second electron injection layer is between the first electron transport layer and the cathode.

14. The method of manufacturing the OLED display substrate according to claim 11, wherein forming the quantum-dot color film layer comprises:

forming a red light quantum-dot layer in a red sub-pixel area, forming a green light quantum-dot layer in a green sub-pixel area, and not forming the quantum-dot color film layer in a blue sub-pixel area.

15. The method of manufacturing the OLED display substrate according to claim 11, wherein forming the quantum-dot color film layer comprises:

forming a red light quantum-dot layer in a red sub-pixel area, forming a green light quantum-dot layer in a green sub-pixel area, and forming a blue light quantum-dot layer in a blue sub-pixel area.

16. The method of manufacturing the OLED display substrate according to claim 11, wherein, prior to forming the quantum-dot color film layer on the light-exiting side of the first blue OLED light-emitting layer and the one or more blue OLED light-emitting layers, the method further comprises:

performing a thin film encapsulation on the first blue OLED light-emitting layer and the one or more blue OLED light-emitting layers.

* * * * *